United States Patent
Bos et al.

(10) Patent No.: US 8,094,051 B2
(45) Date of Patent: Jan. 10, 2012

(54) SIGMA-DELTA-BASED ANALOG-TO-DIGITAL CONVERTER

(75) Inventors: Lynn Bos, Sterrebeek (BE); Julien Ryckaert, Tervuren (BE); Geert Van der Plas, Leuven (DE); Jonathan Borremans, Lier (BE)

(73) Assignees: IMEC, Leuven (BE); Vrije Universiteit Brussel, Brussel (BE)

( * ) Notice: Subject to any disclaimer, the term of this patent is extended or adjusted under 35 U.S.C. 154(b) by 0 days.

(21) Appl. No.: 12/776,124

(22) Filed: May 7, 2010

(65) Prior Publication Data

US 2010/0283649 A1    Nov. 11, 2010

Related U.S. Application Data

(60) Provisional application No. 61/176,266, filed on May 7, 2009.

(51) Int. Cl.
*H03M 3/00* (2006.01)
(52) U.S. Cl. .......................................... 341/143; 341/155
(58) Field of Classification Search .................. 375/147; 341/143, 155
See application file for complete search history.

(56) References Cited

U.S. PATENT DOCUMENTS

| | | | | |
|---|---|---|---|---|
| 5,442,353 A * | 8/1995 | Jackson | ......................... | 341/143 |
| 5,920,589 A * | 7/1999 | Rouquette et al. | ............ | 375/147 |
| 7,126,516 B2 * | 10/2006 | Koc et al. | ....................... | 341/143 |
| 7,180,432 B2 * | 2/2007 | Oliaei | ............................ | 341/143 |
| 2005/0191980 A1 * | 9/2005 | Oliaei | ............................ | 455/205 |

OTHER PUBLICATIONS

Ryckaert, Julien et al., "A 2.4GHz 40mW 40dB SNDR/62dB SFDR 60MHz Bandwidth Mirrored-Image RF Bandpass ADC in 90nm CMOS", IEEE Asian Solid-State Circuits Conference, Nov. 3-5, 2008, Fujuoka, Japan, 4 pages.

Ryckaert et al., "A 2.4GHz 40mW 40dB SNDR/62dB SFDR 60MHz Bandwidth Mirrored-Image RF Bandpass ΣΔ ADC in 90NM CMOS," Nov. 3-5, 2008.

* cited by examiner

*Primary Examiner* — Jean Jeanglaude
(74) *Attorney, Agent, or Firm* — McDonnell Boehnen Hulbert & Berghoff LLP

(57) ABSTRACT

An analog to digital converting device is proposed for generating a digital output signal of an RF analog input signal. The device comprises a first analog to digital converter stage, a mixer, a second analog to digital converter stage and a digital filter. The first analog to digital converter stage generates a first and a second output signal. The first output signal is inputted in the filtering means. The second output signal is being down-converted to a signal with an intermediate frequency or DC. Thereafter, this down-converted signal is being fed to the second analog to digital converter stage. The digital output signal of this second stage is further processed together with the first digital output signal in the digital filter to a digital signal representative of the analog input signal.

13 Claims, 5 Drawing Sheets

--PRIOR ART--

--PRIOR ART--

$$NTF = \frac{Y(z)}{Q(z)} = \frac{1}{1+H} \longleftrightarrow \frac{s}{s+1}$$

→High-pass characteristic

SIGMA-DELTA-BASED ANALOG-TO-DIGITAL CONVERTER

CROSS-REFERENCE TO RELATED APPLICATIONS

The present application claims priority to U.S. Provisional Patent Application Ser. No. 61/176,266 filed in the United States Patent and Trademark Office on May 7, 2009, the entire contents of which is incorporated herein by reference.

FIELD

The present embodiments relate to a device and a method for converting an RF analog input signal into a digital output signal using a cascaded sigma-delta converter, in particular a cascaded RF bandpass sigma delta converter. The embodiments are particularly useful in the field of wireless communications.

BACKGROUND

Steered by CMOS scaling, which allows improvements in the performance of digital circuits while lowering the cost, wireless radios are becoming increasingly digital insensitive. This evolution has revived the suggestion of shifting the signal conditioning of an analog receiver chain to the digital domain by placing a high speed ADC as close as possible to the antenna (see FIG. 1). By digitizing at RF, this architecture becomes a native software radio, nicely scaling with CMOS technologies. Obviously, the very high speed and the large dynamic range required make the design of the ADC very challenging.

Several chip implementations indicate that the best topology in terms of minimum power required to receive a given signal bandwidth at a given resolution for this RF ADC architecture is an RF bandpass sigma-delta converter since it can digitize a high-frequency band-limited signal with high resolution. Traditionally, bandpass sigma-delta ADC's are centered on integer fractions of the sampling clock. To receive e.g. the full ISM band at 2.4 GHz, the sampling clock should be 9.6 GHz in a Fs/4 structure.

Several single loop RF bandpass sigma-delta ADC's report effective number of bits (ENOB) of 6 to 8 bits over a signal bandwidth of around 80 MHz. To be fully compatible with classical receiver architectures, this resolution needs to be increased. This can be done by 1) increasing the oversampling ratio (OSR) by increasing the sampling frequency (Fs); 2) increasing the order of the sigma-delta converter, or 3) increasing the ENOB in the embedded ADC in a sigma-delta converter. The first method is limited for RF BP sigma-delta converters, as the system already operates at its limit in terms of sampling frequency. Stability considerations of higher order sigma-delta converters limit the increase of the order since sigma delta converters with an order larger than 2 have more chance to be unstable. However, the cascaded sigma-delta approach (FIG. 2) achieves a higher overall effective order sigma-delta converter by cascading low-order ($1^{st}$ or $2^{nd}$ order) sigma-delta converters which are inherently stable, leading to an effective higher order.

A so called "2-1" cascade sigma-delta e.g. consists of a first $2^{nd}$ order stage and a second $1^{st}$ order stage. The quantization error (noise) of the first stage is fed into the second stage and is digitized. Digital cancellation filters then combine the outputs of the two stages and reduce the quantization noise of the first stage, so that only the quantization noise of the $2^{nd}$ stage remains. In this way a $3^{rd}$ order noise transfer function (NTF) is created but with the stability of a $2^{nd}$ order sigma-delta, which is unconditionally stable.

SUMMARY

The present disclosure presents a cascaded analog-to-digital converter circuit for converting an analog RF input signal to a digital output signal, comprising:
a first analog to digital converter stage having an input port for receiving the analog RF input signal, and comprising an RF bandpass sigma delta converter for generating a first digital signal and a quantization error signal representative for the quantization error of the first digital signal from the analog RF input signal, respectively presented at a first and second output port of the first analog to digital converter stage;
a down-conversion mixer means connected to the second output port of the first analog to digital converter stage and having components for down-converting the quantization error signal;
a second analog to digital converter stage having an input port connected to the down-conversion mixer means, and components for generating a second digital signal from the down-converted quantization error signal presented at a third output port of the second analog to digital converter stage;
a digital filter connected to the first resp. third output port of the first resp. second analog to digital converter stage and having means for generating the digital output signal by combining the first and second digital signals, thereby reducing a quantization error of the first digital signal.

In an embodiment, the first analog to digital converter stage is a first or second order RF bandpass sigma-delta ADC, and the second analog to digital converter stage is a first or second order sigma-delta ADC or a Nyquist ADC. When using a first or second order sigma-delta ADC or a Nyquist ADC, which are inherently stable, a cascaded analog to digital converter circuit is obtained that is also inherently stable. In this way the design phase is largely simplified, and stability problems as typically encountered in higher order sigma-delta converters are avoided.

In an alternative embodiment, a method for converting an analog RF input signal to a digital output signal, according to the invention comprises: receiving an analog RF input signal and applying it to a RF bandpass sigma delta ADC thereby generating a first digital signal and a quantization error signal representative for the quantization error of the first digital signal; down-converting the quantization error signal into a down-converted error signal by means of a down-conversion mixer means; converting the down-converted error signal into a second digital signal by means of a second analog to digital converter stage; combining the first and second digital signals thereby reducing a quantization error of the first digital signal, and providing it as the digital output signal. By adding a down-conversion mixer between the first and the second analog to digital converter stages, the power consumption of the second stage can be drastically reduced while the effective number of bits of the overall analog to digital converter is only marginally decreased.

BRIEF DESCRIPTION OF THE DRAWINGS

The invention will be further elucidated by means of the following description and the appended figures.

FIG. 3 shows an embodiment of an analog to digital converter circuit according to an embodiment comprising two cascaded analog-to-digital converter stages with a down-conversion mixer in between.

DETAILED DESCRIPTION

Figure 1:
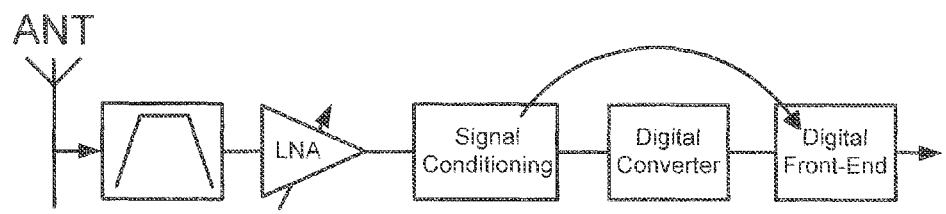
FIG. 1 illustrates the super ADC approach known in the art.

The present disclosure includes reference to particular embodiments and to certain drawings, but the invention is not limited thereto, but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present invention, the only relevant components of the device are A and B.

It is an aim of the present disclosure to describe a device and a method for decreasing the power consumption of an analog to digital converter circuit comprising a sigma-delta converter, without significantly decreasing the resolution.

The analog to digital converting device 2 according to an embodiment is arranged for generating a digital output signal 220 from an RF analog input signal 210. The device 2 of an embodiment comprises a first analog to digital converter stage 3, a down-mixing means 4, a second analog to digital converter stage 5, and a digital filtering means 6. The first analog to digital converter stage 3 comprises an RF bandpass sigma-delta converter and generates a first digital output signal 320 and a second analog output signal 330, the latter being representative for the quantization error of the first digital output signal 320 as will be explained further. The first output signal 320 is a digital output signal and is inputted in the filtering means 6. The second output signal 330 is an analog signal and is being down-converted (frequency shifted) to a signal 420 with an intermediate frequency (low-IF) or DC (zero-IF). An advantage of down-converting to DC is that a Nyquist-rate ADC or a low pass sigma delta converter can be used in the second stage 5. Such converters generally have low power consumption. An advantage of down-converting to an IF frequency instead of to DC is that low-frequency noise can be avoided. In this case a bandpass sigma delta converter can be used as the second analog to digital converter stage 5, consuming slightly more power.

Thereafter, this down-converted signal 420 is fed to the second analog to digital converter stage 5. In one embodiment the second analog to digital converter stage 5 comprises a second sigma-delta converter. In another embodiment, the second analog to digital converter stage 5 comprises a moderate resolution (e.g. 6 bit) Nyquist ADC. The digital output signal 520 of this second stage 5 is further processed together with the first digital output signal 320 of the first stage 3 in the digital filtering means 6 to obtain a digital output signal 220 representative of the RF analog input signal 210 in the RF bandpass frequency band. By applying this conversion method, a digital output 220 is generated with a higher resolution than would be obtained by the first stage 3 only, at only a marginal power increase.

In the system 2 of an embodiment, the first stage 3 is a first or second order RF bandpass sigma delta converter. The operation at RF frequency consumes a lot of power (e.g. 80 mW). Additional stages 5, 8 in cascade at RF frequencies would consume similar amounts of power. According to the embodiment, to reduce the power of these additional stages 5, 8, the analog quantization error signal 330 is down-converted between the two stages. Thus according to the invention a second stage operating at IF frequency is added to the first stage 3 operating at RF frequency. This will substantially reduce the power consumption in the second stage 5 while offering a significant improvement in resolution.

Figure 4:
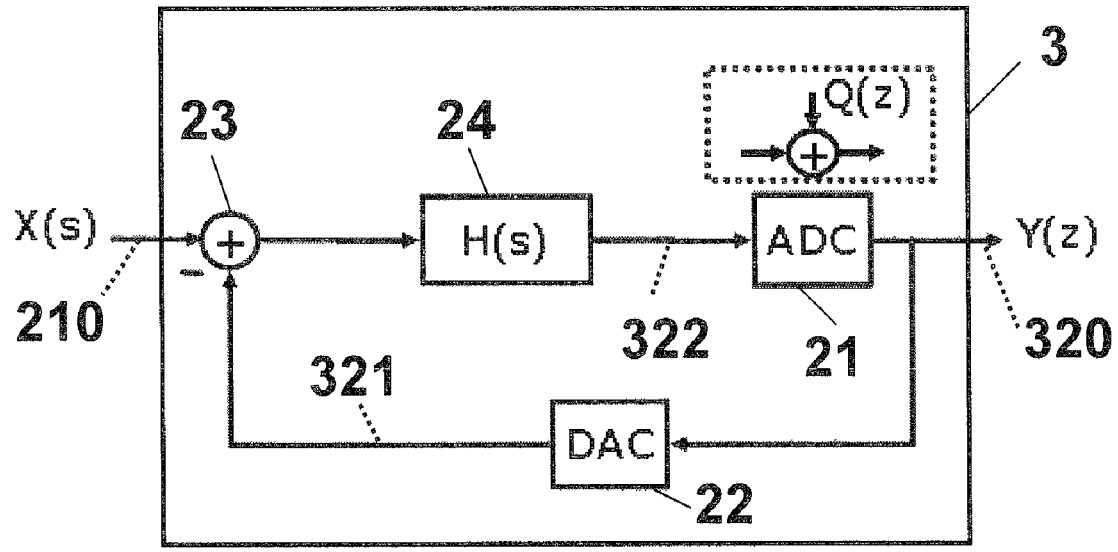
FIG. 4 shows a basic continuous time sigma-delta approach known in the art.
Figure 5:
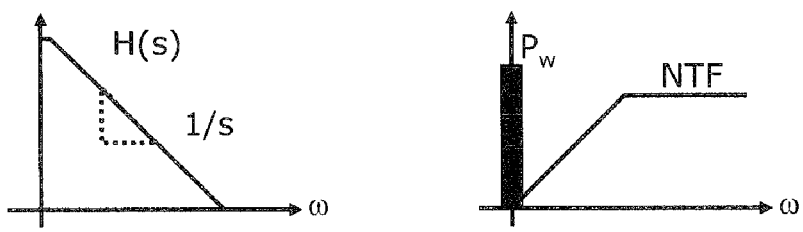
FIG. 5 shows a typical low-pass noise shaping filter used in a sigma-delta converter.

An embodiment is illustrated whereby the first converter stage 3 comprises a sigma delta converter, e.g. an RF bandpass sigma-delta convertor, and the second converter stage 5 comprises an analog to digital converter like for example a sigma delta converter or a Nyquist analog to digital converter. A sigma delta converter is based on an oversampled quantizer ADC, usually a low-resolution ADC, whose quantization noise is shaped by a feedback loop filter H(s) indicated by reference 24. The feedback configuration is chosen such that the quantization noise produced by the low-resolution ADC 21 is shaped and pushed outside the frequency band of interest. This configuration results in a high resolution high SNR for the signal within a finite bandwidth. The typical architecture of such a converter is shown in FIG. 4. The choice of the loop filter 24 will define the quantization noise shaping which is emulated by the noise transfer function NTF. FIG. 5 shows an example of a 1st order low pass noise shaping. Preferably, a bandpass filter 24 is used as exemplified in block 3 of FIG. 3. Note that the quantizer ADC can be a 1 bit converter or more typically up to 4-5 bits. In the feedback path, the quantized digital output signal needs to be subtracted from the RF analog input signal 210. This feedback action requires a DAC 22. Like in any feedback system, any error introduced in the feedback path can be viewed as an error injected directly on the input signal 210 and hence cannot be resolved (shaped) by the feedback action. This is an important constrain for the DAC 22 lying in the feedback path.

Figure 6:
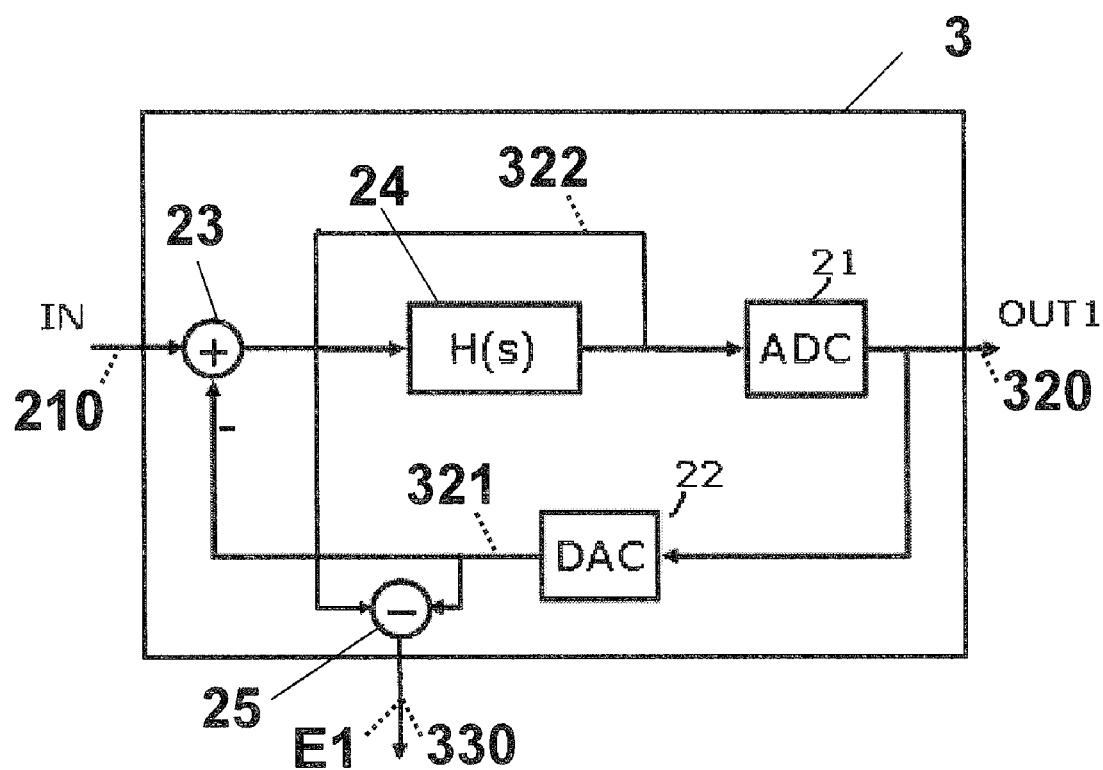
FIG. 6 shows a block diagram of a preferred embodiment of the sigma-delta converter of the first stage.

In an embodiment, the quantization error signal 330 of the first sigma delta converter stage 3 is down-converted to a lower frequency. The first stage 3 is illustrated in FIG. 6. A first analog to digital converter ADC 21 is disposed in a forward path of the first sigma delta converter 3, and a digital-to-analog converter DAC 22 is arranged in a feedback path of the sigma-delta converter stage. The quantization error signal 330 is defined by an analog signal corresponding to the difference between a digital-to-analog-converted output signal 321 of the analog-to-digital converter ADC 21 of the first sigma-delta converter stage 3, and an input signal 322 to the analog-to-digital converter ADC 21 of the first sigma-delta converter stage 3. This quantization error signal 330 is down-converted (frequency shifted) in a down-mixer means 4 using a local oscillator (LO). The down-converted error signal 420 is fed to a second analog to digital converter stage 5. This second analog to digital converter stage 5 may comprise again a sigma delta converter or may comprise a moderate resolution (e.g. 6 bit) Nyquist ADC, such as e.g. a SAR ADC or a flash ADC.

The two generated digital outputs 320 and 520 are further processed by a digital filtering means 6. This digital filtering means 6 uses knowledge of the filters used in the first and second stages 3, 5 for generating a digital output 220 of the RF analog input 210. In case the second analog to digital converter stage 5 is a sigma-delta converter, the filtering concept can simply be illustrated by the following relations. The first output signal 320 is the digital output of the first stage 3: $OUT_1 = STF_1 IN + NTF_1 E_1$, with $STF_1$ the signal transfer function, IN the input, $NTF_1$ the noise transfer function and $E_1$ the quantization noise of the first stage 3. The output signal 520 of the second stage 5 is the digital representation of the quantization error 330 in particular, of an estimate of the quantization error: $OUT_2 = STF_2 \hat{E}_1 + NTF_2 . E_2$ with $STF_2$ the signal transfer function of the second stage 5, $\hat{E}_1$ the estimated quantization noise of the first stage 3, $NTF_2$ the noise transfer function and $E_2$ the quantization noise of the second stage 5. After digital filtering of the outputs of the 2 stages 3, 5 to cancel the contribution in $E_1$, the total output becomes: $OUT_{TOT} = STF_2 STF_1 IN - NTF_1 NTF_2 E_2$.

Figure 3:
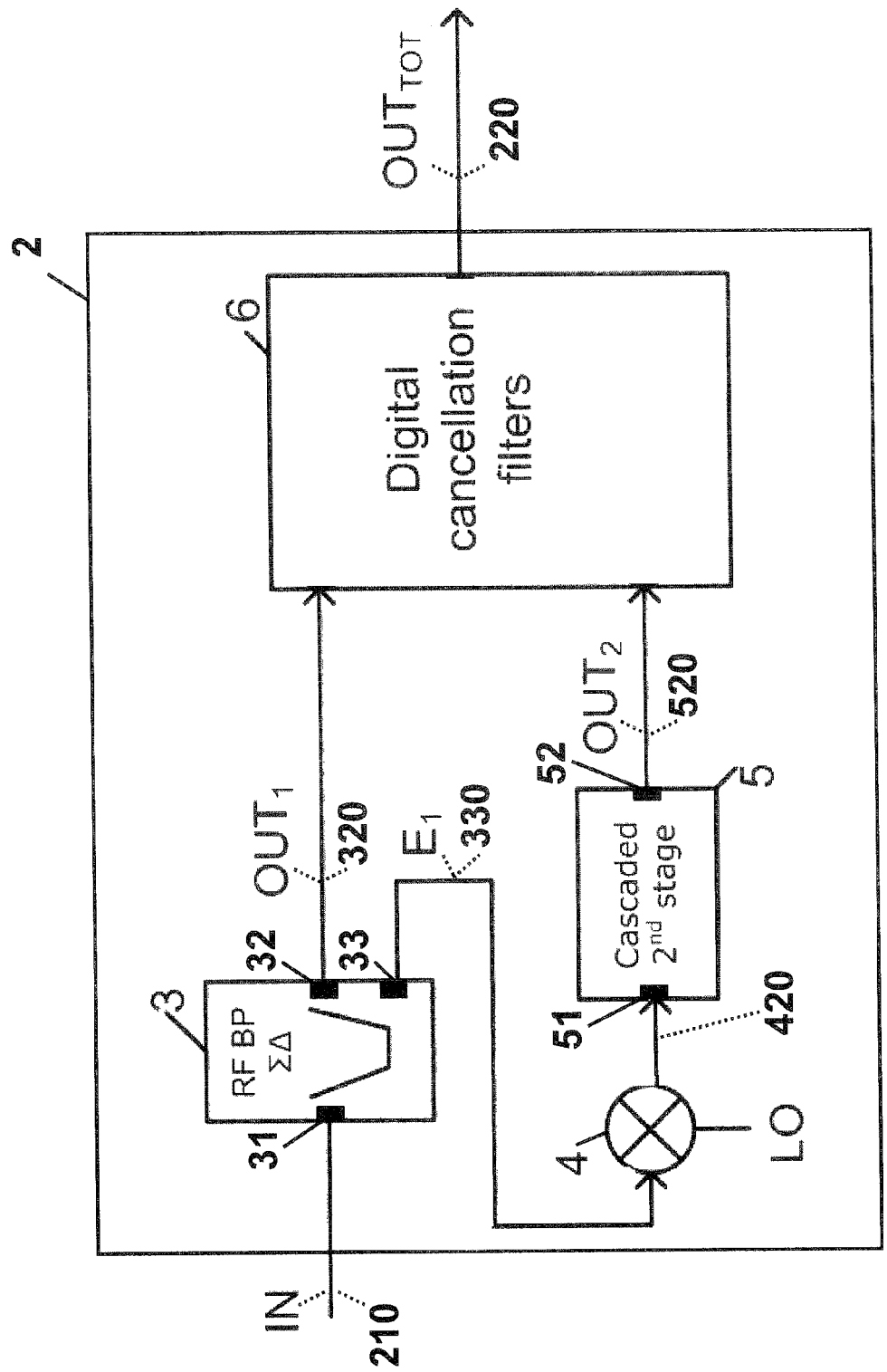

In a practical example, the cascaded analog-to-digital converter circuit of FIG. 3 is used to digitize an RF signal comprising the 2.4 GHz ISM band, the latter being the signal band of interest having a bandwidth of 80 MHz. By digitizing the entire ISM band, the digital signal 220 contains all the digital channels present in the ISM band, which enables simultaneous reception of individual Bluetooth, Wi-Fi and ZigBee signals, which can be separated in the digital domain, but requires a resolution higher than 8 bits. An Fs/4 structure is used for the first sigma delta converter stage 3, thereby using a clock frequency of 9.6 GHz (in reality a clock of 9.76 GHz is used, which is four times the center frequency of 2.44 GHz), thereby achieving an oversampling ratio (OSR) of 9.6 GHz/160 MHz=60. The design of the RF bandpass filter H(s) of the first stage 3 is very challenging because it is at very high frequency and it also needs to have a bandwidth of 80 MHz. Such a bandpass filter can e.g. be built using LC-resonators, as described in [1]. The quantization error signal 330 is down-converted to DC in the down-conversion mixer 4 using a local oscillator (LO) frequency of 2.4 GHz so that the down mixed error signal 420 is a zero-IF signal with frequencies up to 80 MHz. The second analog to digital converter stage 5 uses a Nyquist ADC clocked at 160 MHz to digitize the down mixed error signal 420. The digital filter 6 has two digital input signals: a first input signal 320 at a clock frequency of 9.6 GHz and the second input signal 520 at a clock frequency of 160 MHz. To combine the two signals 320 and 520, the clock frequency of the first signal 320 is first digitally down converted to zero-IF and its rate is lowered to 160 MHz in the digital filter 6 using known decimation techniques. The digital filter block 6 provides digital filtering which matches the implemented filtering in the analog domain to cancel appropriately the quantization noise of the first stage 3.

Figure 2:
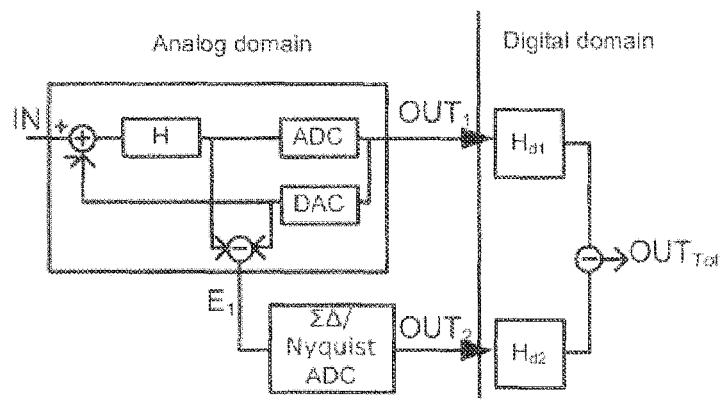
FIG. 2 shows a general block diagram of a cascaded sigma-delta converter known in the art.

When implemented in 90 nm digital CMOS technology, the first stage 3 would consume about 80 mW, the down-converter mixer 4 would consume about 10 mW, and the second stage 5 using a 6-bit flash converter ADC would consume in the order of 2 mW, thus in total 92 mW. Without the down-converting mixer 4 (as shown in the architecture of FIG. 2), the second RF bandpass sigma-delta converter 5 would consume in the order of 40 mW, thus in total 120 mW. The ENOB of the first stage 3 is in the order of 8.5 bit, while the ENOB of the complete cascaded sigma-delta-convertor circuit 2 as described above (with or without the down-converter mixer 4) is about 12 bit. Thus by adding a down-conversion mixer 4 and a low frequency second analog to digital converter stage 5, the present invention allows to increase the ENOB of a single-stage RF sigma-delta converter 3 with an additional 3.5 bits while the extra power consumed is only about 12 mW (15% of 80 mW). Or stated otherwise, by adding a down-conversion mixer 4 to the architecture of FIG. 2, the present invention allows to save about 28 mW (23% of 120 mW) while achieving the same ENOB (about 12 bits) as obtained by two cascaded sigma-delta converter stages without a down-converter mixer 4 between them.

Figure 7:
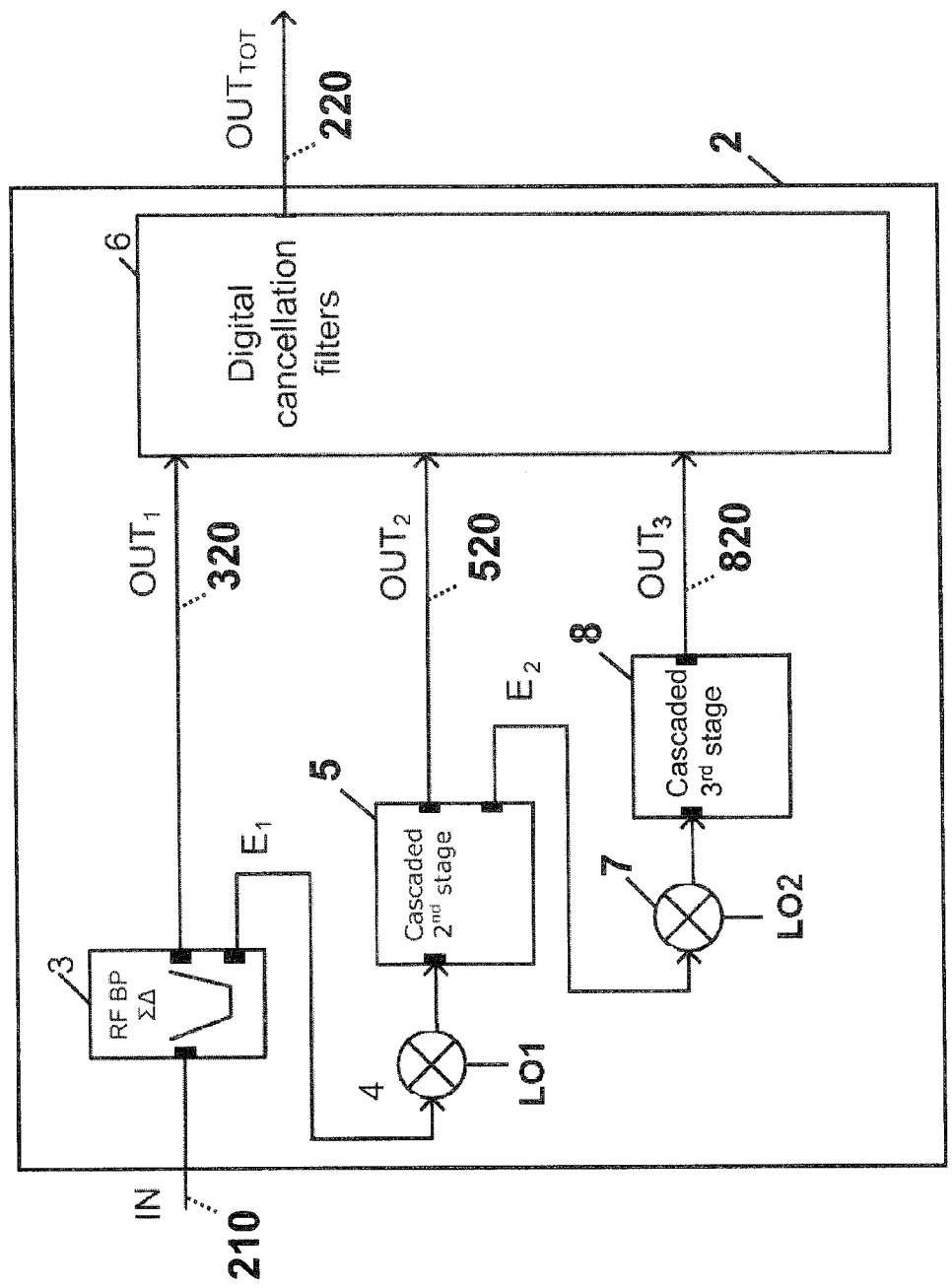
FIG. 7 shows an embodiment of an analog to digital converter circuit according to an embodiment comprising three cascaded analog-to-digital converter stages.

However, the disclosed embodiment is not limited to two cascaded stages. To further increase the resolution of the cascaded analog-to-digital converter circuit 2, a third analog to digital converter stage 8 can be added to the circuit, as shown in FIG. 7. In this case the second stage 5 would also be a first or second order sigma-delta converter providing two output signals: a third (digital) output signal OUT2 being applied to the digital filter 6, and a fourth (analog) output signal E2 representative for the quantization error of the second stage 5, being applied to an input of the third analog to digital converter stage 8, optionally through an additional down-conversion mixer 7. The third analog to digital converter stage 8 can be a first or second order, low-pass or band-pass sigma-delta converter or a Nyquist converter. If the first error signal E1 is down-converted to DC in the first mixer 4 between the first and second stage 3, 5, the second down-conversion mixer 7 needs to be omitted. The digital filter 6 would combine the digital output signals 320, 520, 820 of the three analog to digital converter stages 3, 5, 8 to form a digital signal 220 representative for the analog RF input signal 210, with an increased resolution (ENOB) as would be obtained when using only the first and the second analog to digital converter stages 3, 5 as shown in FIG. 3.

If so desired, more than three stages can also be used.

[1] J. Ryckaert, J. Borremans, B. Verbruggen, J. Van Driessche, L. Van der Perre, J. Craninckx, and G. Van der Plas, "A 2.4 GHz 40 mW 40 dB SNDR/62 dB SFDR 60 MHz bandwidth mirrored-image RF bandpass ΣΔ ADC in 90 nm CMOS" in Proc. IEEE Asian Solid-State Circuits Conf., November 2008, pp 361-364.

We claim:

1. A cascaded analog-to-digital converter circuit, arranged for converting an analog RF input signal to a digital output signal, comprising:
 a first analog to digital converter stage having an input port for receiving the analog RF input signal and comprising an RF bandpass sigma delta converter configured to generate a first digital signal and a quantization error signal representative of the quantization error of the first digital signal from said analog RF input signal, respectively presented at a first and a second output port of the first analog to digital converter stage;

a down-conversion mixer connected to the second output port of the first analog to digital converter stage and configured to down-convert the quantization error signal;

a second analog to digital converter stage having an input port connected to the down-conversion mixer, and configured to generate a second digital signal from said down-converted quantization error signal presented at a third output port of the second analog to digital converter stage;

a digital filter connected to the third output port of the second analog to digital converter stage and configured to generate the digital output signal by combining the first and second digital signals.

2. The converter circuit according to claim 1, wherein the RF bandpass sigma delta converter is a first or second order RF bandpass sigma-delta analog-to-digital converter (ADC).

3. The converter circuit according to claim 1, wherein the first RF bandpass sigma delta converter comprises a first bandpass filter having a first center frequency and wherein the second analog to digital converter stage comprises a first or second order bandpass sigma-delta analog-to-digital converter (ADC) comprising a second bandpass filter having a second center frequency lower than the first center frequency.

4. The converter circuit according to claim 1, wherein the second analog to digital converter stage comprises a first or second order low pass sigma-delta analog-to-digital converter (ADC).

5. The converter circuit according to claim 1, wherein the second analog to digital converter stage comprises a Nyquist analog-to-digital converter (ADC).

6. The converter circuit of claim 1, wherein the digital filter reduces a quantization error of the first digital signal.

7. An RF receiver front-end comprising a cascaded analog-to-digital converter circuit, wherein the cascaded analog-to-digital converter circuit comprises:

a first analog to digital converter stage having an input port for receiving an analog RF input signal and comprising an RF bandpass sigma delta converter configured to generate a first digital signal and a quantization error signal representative of the quantization error of the first digital signal from said analog RF input signal, respectively presented at a first and a second output port of the first analog to digital converter stage;

a down-conversion mixer connected to the second output port of the first analog to digital converter stage and configured to down-convert the quantization error signal;

a second analog to digital converter stage having an input port connected to the down-conversion mixer, and configured to generate a second digital signal from said down-converted quantization error signal presented at a third output port of the second analog to digital converter stage;

a digital filter connected to the third output port of the second analog to digital converter stage and configured to generate a digital output signal by combining the first and second digital signals.

8. A method for converting an analog RF input signal to a digital output signal, comprising:

receiving the analog RF input signal, and applying it to a RF bandpass sigma delta analog-to-digital converter (ADC) to generate a first digital signal and a quantization error signal representative of the quantization error of the first digital signal;

down-converting the quantization error signal into a down-converted error signal by means of a down-conversion mixer;

converting the down-converted error signal into a second digital signal by means of a second analog to digital converter stage;

combining the first and second digital signals and providing it as the digital output signal.

9. The method according to claim 8, wherein the RF bandpass sigma delta analog-to-digital converter (ADC) is a first or second order RF bandpass sigma-delta ADC.

10. The method according to claim 8, wherein the RF bandpass sigma delta ADC comprises a first bandpass filter having a first center frequency, and wherein the down-converted error signal is converted into a second digital signal by means of a first or second order bandpass sigma-delta ADC comprising a second bandpass filter having a second center frequency lower than the first center frequency.

11. The method according to claim 8, wherein the down-converted error signal is converted into a second digital signal by means of a first or second order low pass sigma-delta ADC.

12. The method according to claim 8, wherein the down-converted error signal is converted into a second digital signal by means of a Nyquist ADC.

13. The method according to claim 8, whereby combining the first and second digital signals reduces a quantization error of the first digital signal.

* * * * *